United States Patent
Yan et al.

(10) Patent No.: US 7,298,009 B2
(45) Date of Patent: Nov. 20, 2007

(54) SEMICONDUCTOR METHOD AND DEVICE WITH MIXED ORIENTATION SUBSTRATE

(75) Inventors: Jiang Yan, Newburgh, NY (US); Chun-Yung Sung, Poughkeepsie, NY (US); Danny Pak-Chum Shum, Poughkeepsie, NY (US); Alois Gutmann, Poughkeepsie, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 109 days.

(21) Appl. No.: 11/047,928

(22) Filed: Feb. 1, 2005

(65) Prior Publication Data

US 2006/0170045 A1  Aug. 3, 2006

(51) Int. Cl.
*H01L 27/12* (2006.01)
(52) U.S. Cl. ............... 257/357; 257/255; 257/627; 257/E27.112
(58) Field of Classification Search ......... 257/255, 257/347–354, 369, 371, 627, E27.062, E27.112
See application file for complete search history.

(56) References Cited

U.S. PATENT DOCUMENTS

| | | | |
|---|---|---|---|
| 3,476,991 A | 11/1969 | Mize et al. | |
| 3,603,848 A | 9/1971 | Kohoku-ku et al. | |
| 3,612,960 A | 10/1971 | Tokyo et al. | |
| 3,634,737 A | 1/1972 | Maeda et al. | |
| 4,768,076 A | 8/1988 | Aoki et al. | |
| 4,857,986 A | 8/1989 | Kinugawa | |
| 4,878,957 A | 11/1989 | Yamaguchi et al. | |
| 5,384,473 A | 1/1995 | Yoshikawa et al. | |
| 5,593,915 A | 1/1997 | Ohoka | |
| 5,688,893 A | 11/1997 | Rahman et al. | |
| 5,994,188 A | 11/1999 | Disney | |
| 6,017,801 A | 1/2000 | Youn | |
| 6,294,803 B1 | 9/2001 | Gil | |
| 6,436,748 B1 | 8/2002 | Forbes et al. | |
| 6,815,277 B2 | 11/2004 | Fried et al. | |
| 6,900,503 B2 | 5/2005 | Oh et al. | |
| 6,902,962 B2 | 6/2005 | Yeo et al. | |
| 6,967,132 B2 | 11/2005 | Gonzalez et al. | |

(Continued)

FOREIGN PATENT DOCUMENTS

EP  0 852 416 A1  7/1998

OTHER PUBLICATIONS

Yang, M., et al., "High Performance CMOS Fabricated on Hybrid Substrate With Different Crystal Orientations," 2003 IEDM pp. 18.7.1-18.7.4.

(Continued)

*Primary Examiner*—Marcos D. Pizarro
(74) *Attorney, Agent, or Firm*—Slater & Matsil, L.L.P.

(57) ABSTRACT

A semiconductor device includes a semiconductor body having semiconductor material of a first crystal orientation. A first transistor is formed in the semiconductor material of the first crystal orientation. An insulating layer overlies portions of the semiconductor body and a semiconductor layer overlies the insulating layer. The semiconductor layer has a second crystal orientation. A second transistor is formed in the semiconductor layer having the second crystal orientation. In the preferred embodiment, the semiconductor body is (100) silicon, the first transistor is an NMOS transistor, the semiconductor layer is (110) silicon and the second transistor is a PMOS transistor.

18 Claims, 5 Drawing Sheets

U.S. PATENT DOCUMENTS

| | | |
|---|---|---|
| 6,967,351 B2 | 11/2005 | Fried et al. |
| 6,972,478 B1 | 12/2005 | Waite et al. |
| 2004/0070045 A1 | 4/2004 | Suguro et al. |
| 2004/0082165 A1 | 4/2004 | Kuroi et al. |
| 2004/0121507 A1 | 6/2004 | Bude et al. |
| 2004/0178452 A1 | 9/2004 | Miyasaka |
| 2004/0195646 A1 | 10/2004 | Yeo et al. |
| 2004/0253773 A1 | 12/2004 | Kang |
| 2004/0256700 A1* | 12/2004 | Doris et al. ................. 257/627 |

OTHER PUBLICATIONS

Sheikh F., et al., "The Impact of Device Orientation on Width-Quantized FinFET Circuits," EE 241 Spring 2004, pp. 1-6.

Yang, J., et al., "Edge Transistor Elimination in Oxide Trench Isolated N-Channel Metal-Oxide-Semiconductor Field Effect Transistors," 2001 American Vacuum Society, Feb. 5, 2001, pp. 327-332.

* cited by examiner

SEMICONDUCTOR METHOD AND DEVICE WITH MIXED ORIENTATION SUBSTRATE

TECHNICAL FIELD

The present invention relates generally to semiconductor devices, and more particularly to a semiconductor method and device with mixed orientation substrate.

BACKGROUND

Complementary metal oxide semiconductor (CMOS) is a dominant technology in semiconductor device manufacture. A CMOS device includes both n-channel (NMOS) and p-channel (PMOS) transistors. In CMOS technology, both kinds of transistors are used in a complementary way to form a current gate that forms an effective means of electrical control. Advantageously, CMOS transistors use very little power when not switching from one state to another.

It is known that the mobility of carriers is dependent on a number of factors, especially the surface plane of a wafer. Conventional silicon substrates typically have a surface oriented on the (100) crystal plane. In this plane, the mobility of electrons is higher than in other crystal planes, and therefore, the source-drain current of an n-channel FET formed on the semiconductor substrate having the (100) plane provides the largest current. However, the mobility of holes is not optimized in the (100) plane, and therefore, the source-drain current of a p-channel FET formed on the semiconductor substrate having the (100) plane is inevitably small. The p-channel FET therefore fails to have desirable characteristics, even though the n-channel FET exhibits good characteristics. Hole mobility could be enhanced, especially at high electric fields, if p-channel FETs were formed on the (110) plane.

U.S. Pat. No. 5,384,473 discloses a semiconductor body having element formation surfaces with different orientations. The semiconductor body is constructed in such a manner that a first semiconductor substrate of the (100) plane is laminated to a second semiconductor substrate of the (110) plane. At least one opening is made in the first semiconductor substrate to expose the second semiconductor substrate. An n-channel transistor can be formed in the first semiconductor substrate while a p-channel transistor is formed in the second semiconductor substrate.

U.S. Pat. No. 6,815,277 discloses FinFETs that are formed on the same substrate utilizing various crystal planes for FET current channels in order to optimize mobility and/or to reduce mobility. A substrate has a surface oriented on a first crystal plane that enables subsequent crystal planes for channels to be utilized. A first transistor is also provided having a first fin body. The first fin body has a sidewall forming a first channel, the sidewall oriented on a second crystal plane to provide a first carrier mobility. A second transistor is also provided having a second fin body. The second fin body has a sidewall forming a second channel, the sidewall oriented on a third crystal plane to provide a second carrier mobility that is different from the first carrier mobility.

The paper by Yang et al., entitled High Performance CMOS Fabricated on Hybrid Substrate With Different Crystal Orientations," 2003 IEDM, pp. 18.7.1-18.7.4 discloses a structure and technology for high performance CMOS using hybrid silicon substrates with different crystal orientations through wafer bonding and selective epitaxy. This type of mixed orientation substrate (MOS) is a new and excellent technology to boost the PMOS performance by using a (110) substrate while maintaining the NMOS performance by using (100) substrate. One of the challenges with a mixed orientation substrate lies in isolating the (110) portions of the substrate from the (100) portions of the substrate and at same time to make the good alignment with the shallow trench isolation (STI) later on, especially for the technologies below 45 nm.

SUMMARY OF THE INVENTION

These and other problems are generally solved or circumvented, and technical advantages are generally achieved, by preferred embodiments of the present invention which provides a method to form a mixed orientation substrate and the isolation in the same process module.

In accordance with a preferred embodiment of the present invention, a semiconductor device includes a semiconductor body having semiconductor material of a first crystal orientation. A first transistor is formed in the semiconductor material of the first crystal orientation. An insulating layer overlies portions of the semiconductor body and a semiconductor layer overlies the insulating layer. The semiconductor layer has a second crystal orientation. A second transistor is formed in the semiconductor layer having the second crystal orientation. In the preferred embodiment, the semiconductor body is (100) silicon, the first transistor is an NMOS transistor, the semiconductor layer is (110) silicon and the second transistor is a PMOS transistor.

In accordance with another embodiment of the present invention, a method of making a semiconductor device includes providing a wafer that includes a semiconductor body with semiconductor material of a first crystal orientation. An insulating layer overlies the semiconductor substrate and a semiconductor layer with semiconductor material of a second crystal orientation overlies the insulating layer. Portions of the semiconductor layer and the insulating layer are removed to expose a portion of the semiconductor body. A first transistor of a first conductivity type (e.g., n-channel) is formed in the semiconductor material of the first crystal orientation and a second transistor of a second conductivity type (e.g., p-channel) is formed in the semiconductor material of the second crystal orientation.

In another embodiment, a method of forming a semiconductor device once again includes providing a wafer that includes a semiconductor substrate of a first crystal orientation, an insulating layer over the semiconductor substrate, and a semiconductor layer of a second crystal orientation over the insulating layer. A portion of the semiconductor layer is removed to expose a portion of the insulating layer. Insulating material is formed over the wafer. Portions of the insulating material are removed to expose portions of the semiconductor layer and portions of the insulating material and insulating layer are removed to expose portions of the semiconductor substrate. Semiconductor material of the first crystal orientation is epitaxially grown over the exposed portions of the semiconductor substrate and semiconductor material of the second crystal orientation is epitaxially grown over exposed portions of the semiconductor layer.

An advantage of a preferred embodiment of the present invention is the elimination of the typical shallow trench isolation process module including the trench filling. Since the active semiconductor areas are formed using an epitaxial process this process module is eliminated. In other words, in the preferred embodiment, the isolation regions are formed before the formation of the active semiconductor regions.

A further advantage of a preferred embodiment of the present invention is that only two masks are needed and the STI trench definition masks are avoided. Since the active areas are typically larger than the STI, the critical dimension of this mask is relaxed. Further, the total process steps are reduced significantly from a conventional process. Any reduction in process steps and complexity will lead to cost reductions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a mixed crystal orientation silicon substrate used to optimize CMOS device performance. The invention may also be applied, however, to other semiconductor devices such as bipolar and BiCMOS and other semiconductors such as silicon germanium.

An exemplary structure of the present invention will be described with respect to FIG. 1. A process flow for manufacturing this structure will then be described with reference to FIGS. 2-16. An alternative structure is shown in FIG. 17.

Figure 1:
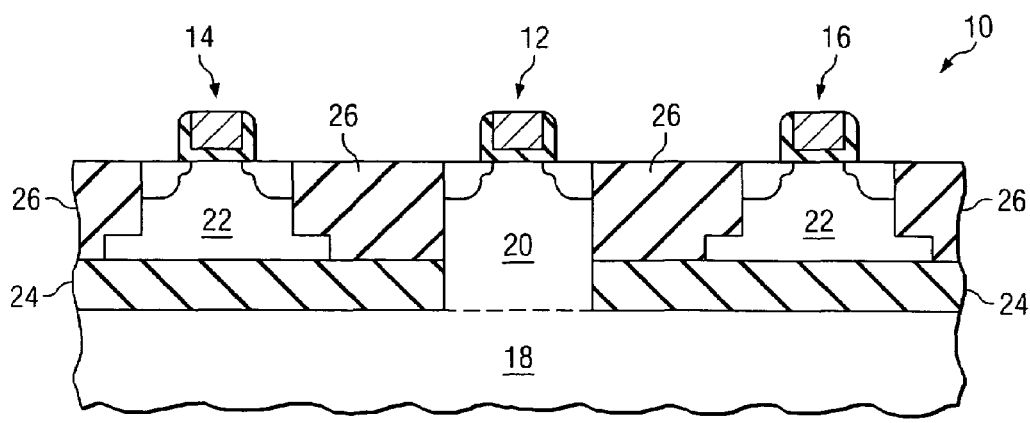
FIG. 1 is a preferred embodiment semiconductor device.

Referring first to FIG. 1, a semiconductor device 10 includes a first transistor 12 of a first conductivity type and second transistors 14, 16 of a second conductivity type. To enhance performance, the first transistor is formed in a semiconductor material of a first crystal orientation and the second transistors 14 and 16 are formed in semiconductor material of a second crystal orientation. In the preferred embodiment, the first transistor 12 is an n-channel field effect transistor (FET) formed in (100) silicon and the second transistors 14 and 16 are p-channel FETs formed in (110) silicon. In an alternate embodiment, the positions of the (100) orientation semiconductor and (110) orientation semiconductor could be switched with each other. In other words, the body substrate 18 orientation could be either (100) or (110).

To achieve the different crystal orientations, the n-channel transistor 12 is formed in a portion 20 of substrate 18. As will be described below, the portion 20 is preferably epitaxially grown semiconductor material, the material having a crystal orientation that aligns to the crystal orientation the substrate 18. In the preferred embodiment, substrate 18 is a (100) monocrystalline silicon substrate. Semiconductor 20 is, therefore, also (100) monocrystalline silicon and can be considered a portion of the substrate 18.

The transistors 14 and 16 are formed in portions of a semiconductor layer 22. The semiconductor layer 22 preferably (although not necessarily) has a different crystal orientation from semiconductor material 20. In the preferred embodiment, the semiconductor layer is (110) silicon (and the semiconductor body 20 is (100) silicon). In another embodiment, the semiconductor layer is (100) silicon and the semiconductor body 20 is (110) silicon.

The semiconductor layer 22 is separated from the substrate 18 by an insulating layer 24. The insulating 24 is preferably an oxide layer, sometimes referred to as a buried oxide. In other embodiments, other insulating materials such as nitrides, oxynitrides and high-k dielectric materials could alternatively be used. In the illustrated embodiment, the insulating layer 24 has an opening through which the semiconductor material 20 extends.

The semiconductor region 20 is separated from semiconductor regions 22 by isolation regions 26. Isolation regions 26 are preferably formed from an oxide (e.g., silicon dioxide) but other materials can alternatively be used. Due to the process used to form the isolation regions 26, which will be described in greater detail below, the isolation regions can have a lateral dimension that is as small as the minimum lithographic dimension of the device.

A preferred embodiment process for forming a structure of the present invention will now be described with reference to FIGS. 2-16. These figures illustrate one specific process. It is understood, however, that numerous variations and alternatives can be incorporated into the process flow. While the figures reference specific materials (e.g., (100) Si and (110) Si), it is also understood that other materials as discussed herein or otherwise recognized by one of ordinary skill in the art could alternatively be used.

Figure 2:
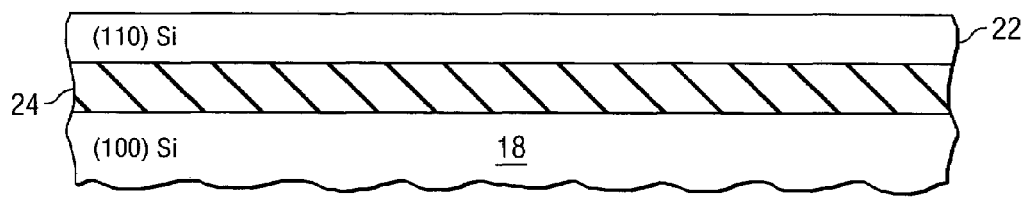
FIGS. 2-16 are cross-sections showing various stages of fabrication of a preferred embodiment device.

Referring first to FIG. 2, a silicon-on-insulator (SOI) wafer 8 is provided. The SOI wafer 8 includes a substrate 18, an insulating layer 24 that overlies substrate 18 and a semiconductor layer 22. In the preferred embodiment, the substrate 18 comprises a (100) bulk silicon substrate. In other embodiments, the substrate 18 can comprise silicon of different crystal orientations, e.g., (110) or (111), or different semiconductor materials, such as silicon germanium, gallium arsenide.

The insulating layer 24 and the semiconductor layer 22 can be formed in a variety of ways. For example, insulating layer 24 can be deposited or grown over the surface of the substrate 18 and the semiconductor layer 22 can be bonded with the insulating layer 24 using a special bonding technique. For example, the semiconductor layer 22 (and possibly insulating layer 24) is bonded or laminated to the substrate 18. For example, a donor wafer that includes the silicon layer 22 can be bonded to a target wafer 18 that includes insulator 24. During a wafer separation process, such as the Smartcut™ process, a splitting plane in one oxidized silicon wafer is defined by hydrogen implantation close beneath the oxide layer. Bonding of the donor wafer to the target wafer and subsequent separation at the pre-defined plane, results in a thin remaining layer of single crystalline silicon 22 on top of the insulating layer 24 and the underlying silicon substrate 18.

A substrate illustrated in FIG. 2 can also be purchased as such. For example, bonded wafers with two different orientations are available from companies such as SEH America of Vancouver, Wash.

Figure 3:
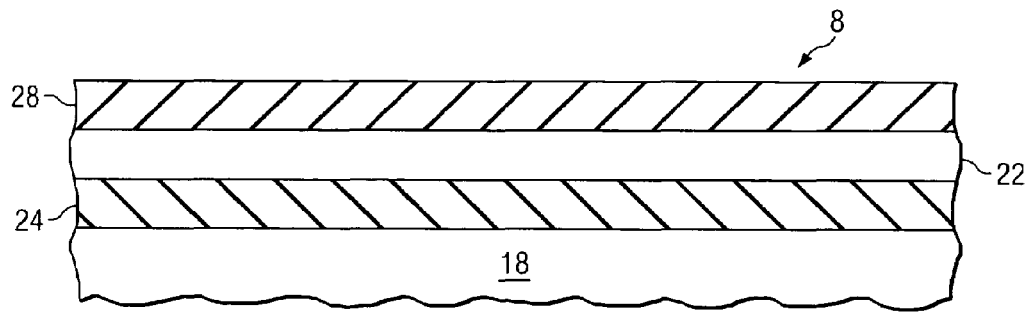

Referring to FIG. 3, a hard mask layer 28 is formed over the semiconductor layer 22. In the preferred embodiment, the hard mask layer 28 is an oxide layer formed by the decomposition of tetraethyloxysilane and is, therefore, often referred to as a TEOS layer. The TEOS layer 28 is preferably formed to a thickness of between about 50 nm and 500 nm, preferably about 200 nm. Other materials could be used for the hard mask. For example, the hard mask could be silicon nitride, silicon oxynitride, boron doped oxide (BSG) or boron and phosphorous doped oxide (BPSG). The hard mask 28 can be one single layer or multi-layers.

Figure 4:
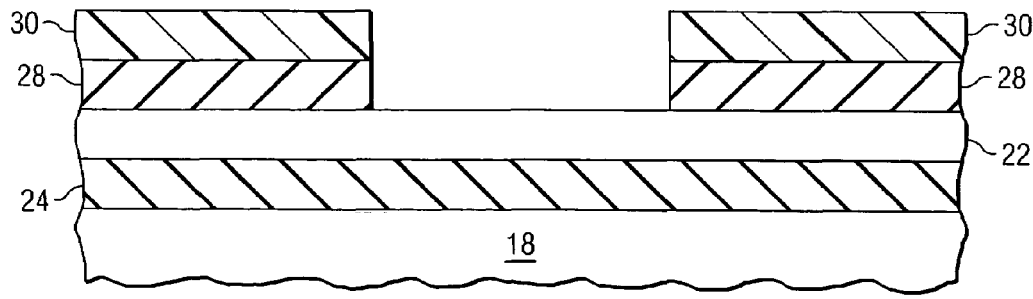

Referring next to FIG. 4, a resist layer 30 is formed over the hard mask layer 28. The resist layer 30 can be any photoresist used in standard lithography processing. As also shown in the figure, the resist 30 is patterned to expose a portion of the hard mask layer 28. The exposed portion of hard mask layer 28 can then be removed to expose a portion of the semiconductor layer 22.

Figure 5:
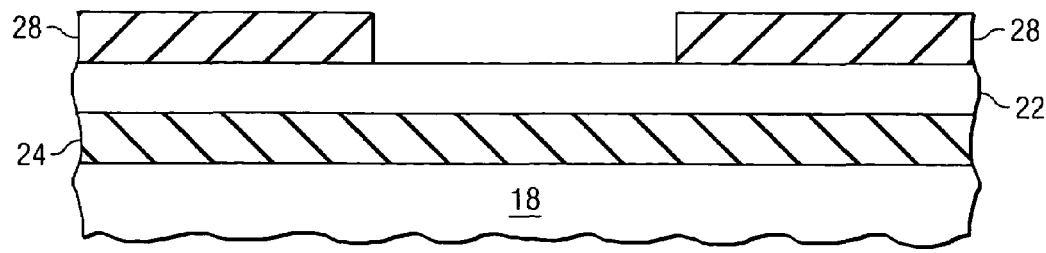

FIG. 5 illustrates the wafer after the photoresist 30 has been stripped.

Figure 6:
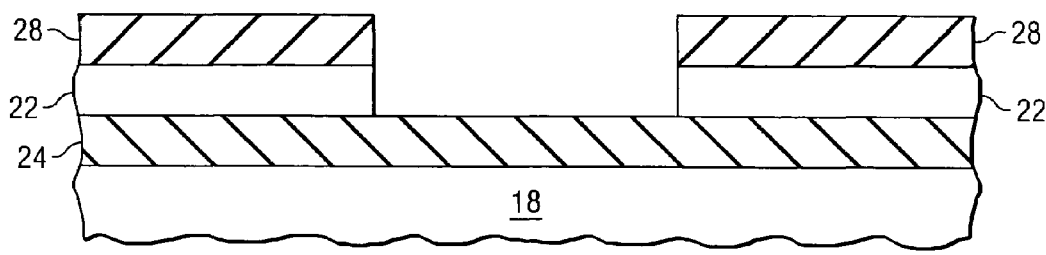

Referring to FIG. 6, the exposed portions of semiconductor layer 22 are removed using the remaining portions of the hard mask layer 28 as a mask. This removal can be done by aniosotropic etching. In an embodiment that is not illustrated, the hard mask layer 28 can be replaced with a photoresist.

Figure 7:
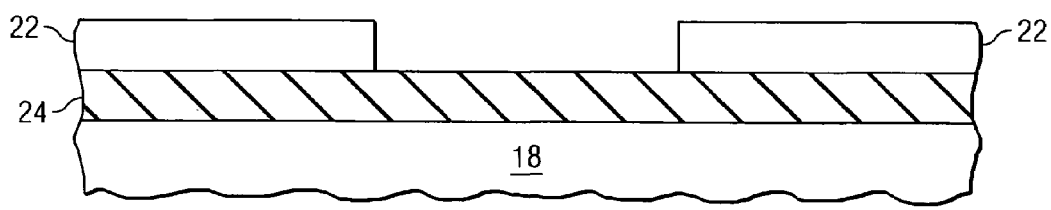

As illustrated in FIG. 6, the hard mask layer 28 may be thinned during removal of the portions of silicon layer 22. FIG. 7 shows that any remaining portions of the hard mask layer 28 can be removed. This removal can be performed, for example, by plasma etching.

Figure 8:
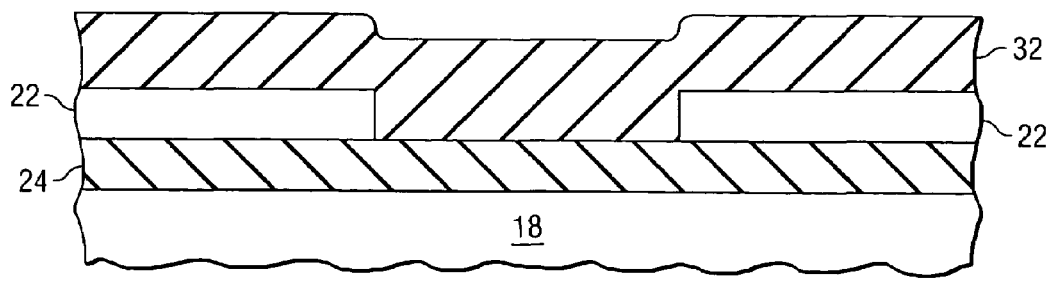
Figure 9:
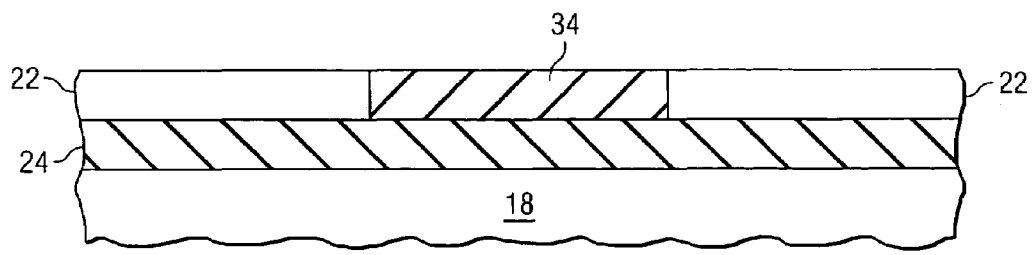

Referring next to FIGS. 8 and 9, an insulating material 34 is formed where the portions of the semiconductor layer 22 were removed. In the preferred embodiment, an insulating layer 32 is deposited (FIG. 8) and planarized to be substantially co-planar with the upper surface of semiconductor layer 22. For example, an oxide layer can be deposited using a high density plasma (HDP) process followed by a chemical mechanical polish (CMP) step. In alternate embodiments, the insulating material 32 can be an oxide formed by a different process or a different material such as a nitride or doped glass (e.g., fluorinated silica glass).

Figure 10:
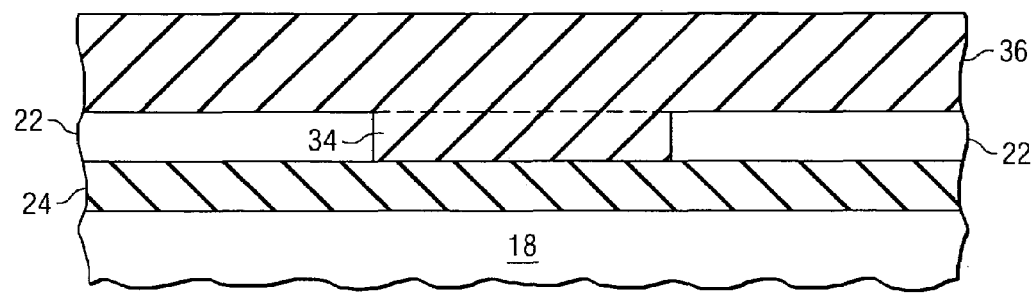

Turning now to FIG. 10, an insulating layer 36 is depositing over the wafer. In the preferred embodiment, the insulating layer 36 is the same material as insulator 34, e.g., insulators 34 and 36 can both be silicon dioxide. As an example, the insulating layer 36 can be an HDP oxide layer (i.e., an oxide deposited using a high density plasma process). Other oxide deposition processes can alternatively be allowed. In other embodiments, the two layers can be different materials, such as combinations of the materials listed above.

Figure 11:
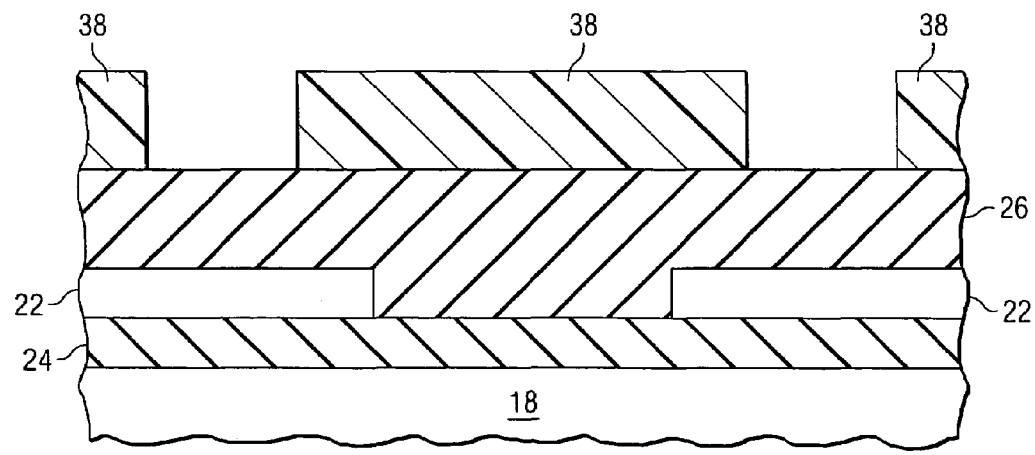
Figure 12:
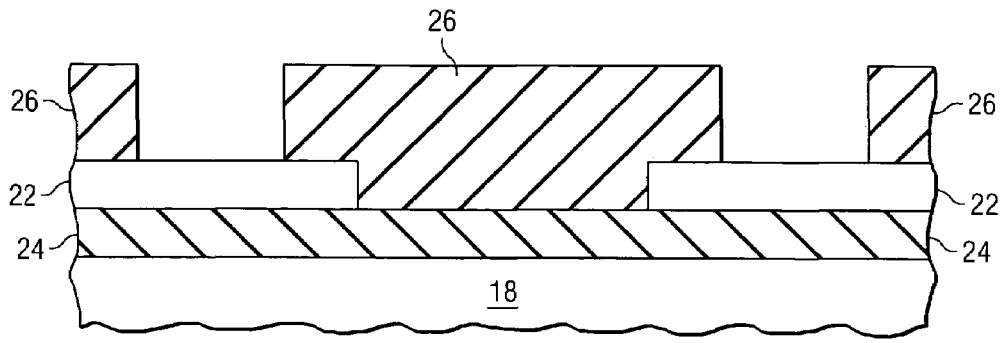

FIGS. 11-14 illustrate the formation of isolation regions 26. (The isolations regions 26 are formed from insulating regions 34 and 36, which are renumbered to correspond with FIG. 1.) As shown in FIG. 11, a resist 38 is formed over the wafer and patterned to expose portions of isolation region 26 that overlie the semiconductor islands 22. The exposed portions of the isolation region 26 can then be removed, as shown in FIG. 12.

Figure 13:
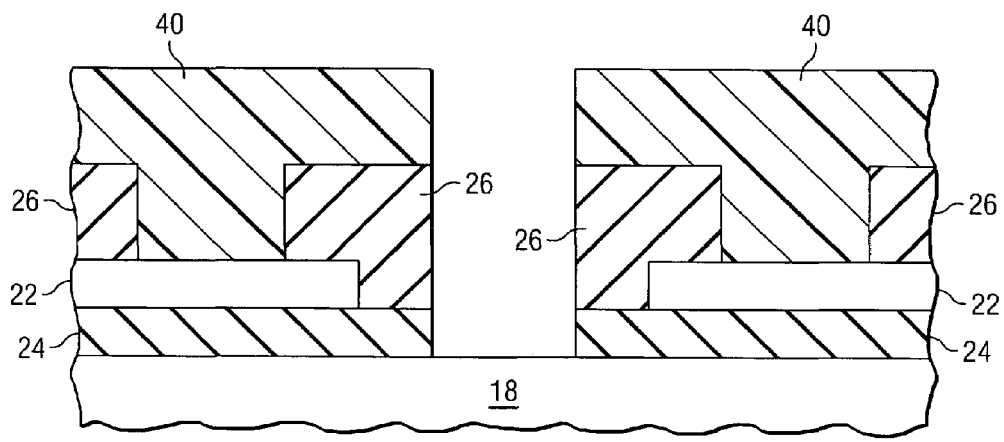
Figure 14:
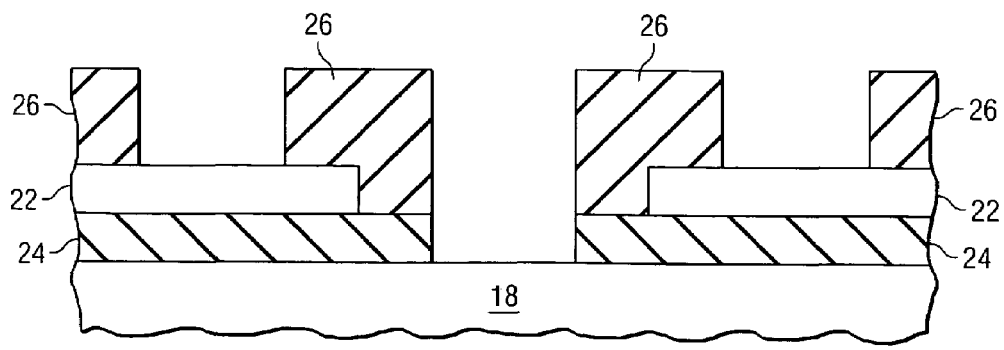

After resist layer 38 is stripped, a second resist layer 40 is formed and patterned to expose portions of isolation region 26 over the substrate 18 where insulating layer 24 has been removed. Using the patterned resist layer 40 as a mask, the semiconductor substrate 18 is exposed, as shown in FIG. 13. FIG. 14 illustrates the structure after resist 40 has been stripped.

In an alternate embodiment, a single resist layer can be patterned to create the openings shown in FIGS. 11 and 13. This modification would save one mask step. In this case, an etch stop layer (not shown), such as silicon nitride when the isolation region 26 is an oxide, is preferably formed over layer 22 to protect the semiconductor while the etching process continues through the thicker portions of isolation region 26 that overlie the substrate 18. Once the resist is removed, the structure of FIG. 14 will be obtained.

Figure 15:
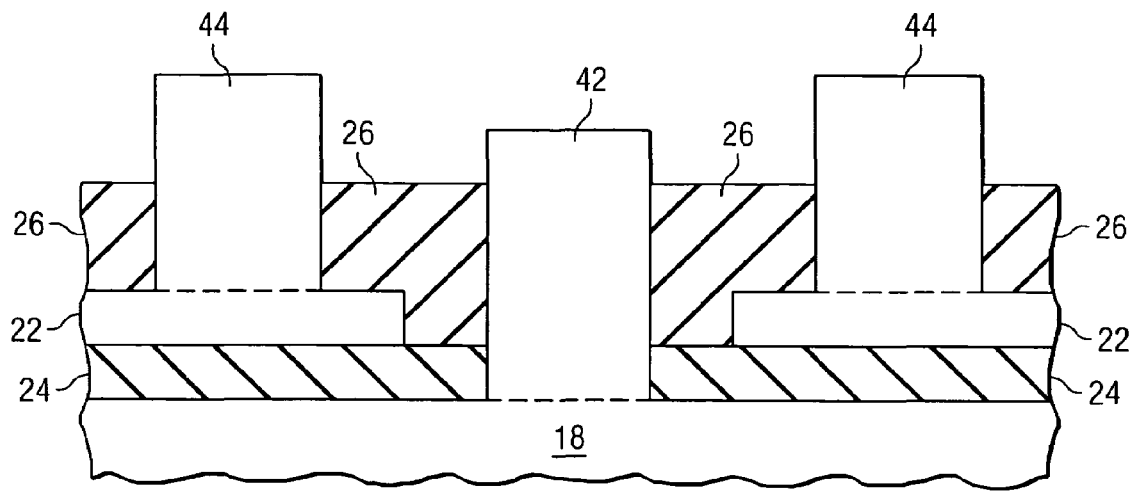

Referring next to FIG. 15, semiconductor regions 42 and 44 are epitaxially grown using semiconductor regions 18 and 22, respectively, as a seed layers. In the preferred embodiment, silicon regions 42 and 44 are grown over silicon bodies 18 and 22, respectively. In this case, the semiconductor material of the bodies 18 and 22 are the same as the semiconductor material of the grown layers 42 and 44. In other embodiments, however, this need not be the case. For example, to form a strained semiconductor layer, a layer of silicon can be grown over a silicon-germanium body 18 and/or 22, e.g., a silicon germanium substrate or a silicon-germanium layer over a substrate. In other examples, other combinations of materials are possible.

In the preferred embodiment, the insulating layer 36 (see FIG. 10; this layer is labeled in FIG. 15 as 26) was formed to a thickness of between about 100 nm and 500 nm, preferably about 350 nm. In other embodiments, the thickness can be greater (e.g., up to about 2000 nm) or thinner (e.g., down to about 10 nm). The silicon regions 42 and 44 are preferably grown to about this same thickness. In a less preferred embodiment, the silicon 42/44 can be grown above the level of the isolation region 26 and a further insulator deposition (not shown) can be performed to fill the regions over the isolation region 26.

Figure 16:
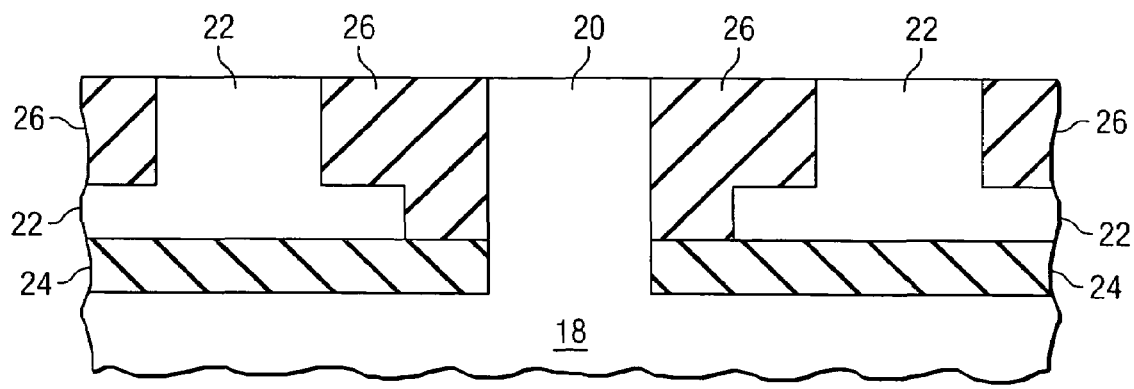
Figure 17:
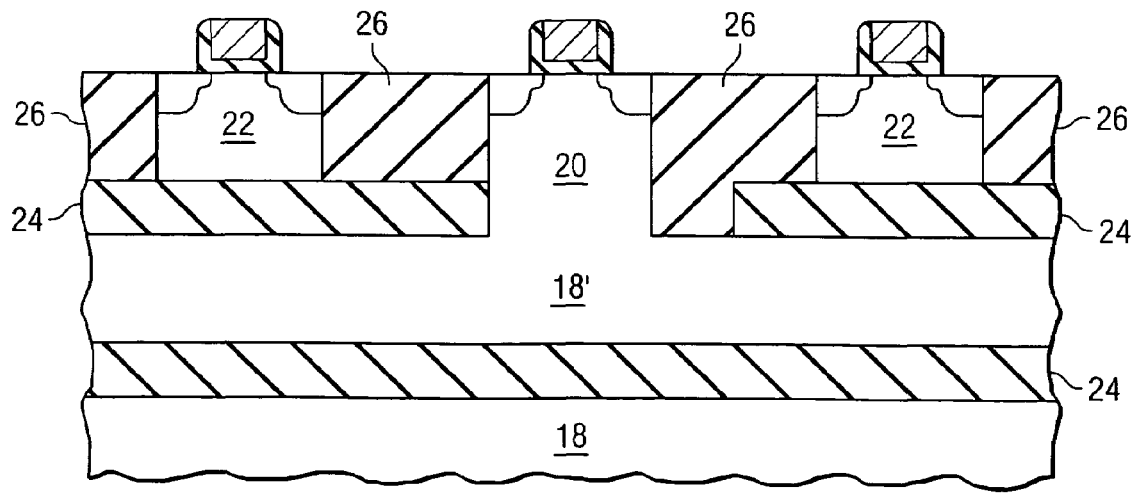
FIG. 17 is an alternate embodiment device.

Referring now to FIG. 16, the top surface of the silicon regions 42 and 44 is planarized to be substantially planar with the top surface of isolation regions 26. The portions of the silicon layer 20 and 22 that remain between the isolation regions 26 can be used as active areas. While it is preferable that the active areas 20/22 and isolation regions 26 are co-planar, this is not required. The planarization step is preferably performed using a chemical-mechanical polish (CMP). Other planarization techniques, such as etch back, can alternatively be used. In an alternate embodiment, a thermal oxide (not shown) can be grown over the active areas 20/22 and then removed to get a fresh silicon surface. Other alternatives include the post thermal anneal to remove the defects and improve the top silicon layer quality.

The structure of FIG. 16 can now be used as the starting point for device fabrication. For example, transistors 12 and 14 can be formed as shown in FIG. 1. Other components such as diodes, resistors, capacitors can also be fabricated to form the desired circuits. It is noted that the structure of FIG. 16 varies from the structure of FIG. 1. These differences are intended to demonstrate that the present invention is applicable in a variety of contexts.

An alternate embodiment is illustrated in FIG. 17. In FIG. 17 one of the active regions 20 is formed from an SOI wafer while the other regions 22 are formed on semiconductor layers that overlie the SOI. This embodiment is presented as an example of the wide variety of alternatives that can be encompassed by the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a semiconductor body having semiconductor material of a first crystal orientation;

a first transistor formed in the semiconductor material of the first crystal orientation;

an insulating layer overlying portions of the semiconductor body;

a semiconductor layer overlying the insulating layer, the semiconductor layer having a second crystal orientation;

a second transistor formed in the semiconductor layer having the second crystal orientation; and an isolation region disposed over the insulating layer between the first transistor and the second transistor, wherein the isolation region is laterally positioned such that the entire isolation region overlies the insulating layer.

2. The device of claim 1 wherein:
the semiconductor body comprises (100) silicon;
the first transistor comprises an n-channel field effect transistor;
the semiconductor layer comprises (110) silicon; and
the second transistor comprises a p-channel field effect transistor.

3. The device of claim 1, wherein the isolation region has a lateral dimension that is as small as a minimum lithographic dimension of the device.

4. The device of claim 1 wherein the first transistor is formed in an epitaxially grown portion of the semiconductor body and wherein the second transistor is formed in an epitaxially grown portion of the semiconductor layer.

5. The device of claim 4 wherein a portion of the isolation region overlies a portion of the semiconductor layer.

6. A semiconductor device comprising:
a semiconductor body having semiconductor material of a first crystal orientation;
a first transistor formed in the semiconductor material of the first crystal orientation;
an insulating layer overlying portions of the semiconductor body;
a semiconductor layer overlying the insulating layer, the semiconductor layer having the second crystal orientation;
a semiconductor region overlying the semiconductor layer, the semiconductor region having the second crystal orientation;
a second transistor formed in the semiconductor region; and
an isolation region disposed over the semiconductor body and located laterally between the first transistor and the second transistor;
wherein the semiconductor region has a lateral dimension that is less than a lateral dimension of the semiconductor layer so that a portion of the semiconductor layer extends beyond the semiconductor region, wherein the isolation region overlies the portion of the semiconductor layer that extends beyond the semiconductor region.

7. The device of claim 1 wherein:
the semiconductor body comprises (100) silicon;
the first transistor comprises an n-channel field effect transistor;
the semiconductor layer comprises (110) silicon; and
the second transistor comprises a p-channel field effect transistor.

8. The device of claim 1, wherein the semiconductor region comprises an epitaxially grown semiconductor region.

9. The device of claim 1, wherein the isolation region has a lateral dimension that is as small as a minimum lithographic dimension of the device.

10. The device of claim 6 wherein the semiconductor body comprises a bulk monocrystalline silicon substrate.

11. The device of claim 10 wherein the silicon substrate comprises (100) silicon and wherein the semiconductor layer comprises (110) silicon.

12. A semiconductor device comprising:
a semiconductor body having semiconductor material of a first crystal orientation;
an insulating layer overlying portions of the semiconductor body;
a semiconductor layer overlying the insulating layer, the semiconductor layer having a second crystal orientation, the semiconductor layer having an opening over a portion of the semiconductor body, the opening being defined by sidewalls in the semiconductor layer;
a first semiconductor region overlying the semiconductor body and having an upper surface, the first semiconductor region being of the first crystal orientation;
a second semiconductor region overlying the semiconductor layer and having an upper surface that is substantially co-planar with the upper surface of the first region, the second semiconductor region being of the second crystal orientation, wherein the second semiconductor region has a lateral dimension that is less than a lateral dimension of the semiconductor layer so that a portion of the semiconductor layer extends beyond the semiconductor region;
an isolation region disposed over the semiconductor body and located laterally between the first region and the second region, the isolation region having sidewalls that are substantially aligned with the sidewalls of the insulating layer such that the first semiconductor region abuts the substantially aligned sidewalls, wherein the isolation region overlies the portion of the semiconductor layer that extends beyond the second semiconductor region;
a first transistor formed in the first semiconductor region; and
a second transistor formed in the second semiconductor region.

13. The device of claim 12, wherein the second semiconductor region comprises an epitaxially grown semiconductor region.

14. The device of claim 12 wherein:
the semiconductor body comprises (100) silicon;
the first transistor comprises an n-channel field effect transistor;
the semiconductor layer comprises (110) silicon; and
the second transistor comprises a p-channel field effect transistor.

15. The device of claim 12, wherein the first semiconductor region comprises an epitaxially grown semiconductor region.

16. The device of claim 15, wherein the second semiconductor region comprises an epitaxially grown semiconductor region.

17. The device of claim 12 wherein the semiconductor body comprises a bulk monocrystalline silicon substrate.

18. The device of claim 17 wherein the silicon substrate comprises (100) silicon and wherein the semiconductor layer comprises (110) silicon.

* * * * *

UNITED STATES PATENT AND TRADEMARK OFFICE
CERTIFICATE OF CORRECTION

PATENT NO. : 7,298,009 B2  Page 1 of 1
APPLICATION NO. : 11/047928
DATED : November 20, 2007
INVENTOR(S) : Yan et al.

It is certified that error appears in the above-identified patent and that said Letters Patent is hereby corrected as shown below:

In Col. 7, line 57, delete "1" and insert --6--.
In Col. 7, line 64, delete "1," and insert --6,--.
In Col. 8, line 1, delete "1," and insert --6,--.

Signed and Sealed this

Fifteenth Day of April, 2008

JON W. DUDAS
*Director of the United States Patent and Trademark Office*